United States Patent [19]
Abrokwah et al.

[11] Patent Number: 5,937,285
[45] Date of Patent: Aug. 10, 1999

[54] METHOD OF FABRICATING SUBMICRON FETS WITH LOW TEMPERATURE GROUP III-V MATERIAL

[75] Inventors: Jonathan K. Abrokwah; Ravi Droopad, both of Tempe; Corey D. Overgaard, Phoenix; Brian Bowers, Mesa; Michael P. LaMacchia, Gilbert; Bruce A. Bernhardt, Chandler, all of Ariz.

[73] Assignee: Motorola, Inc., Schaumburg, Ill.

[21] Appl. No.: 08/863,109

[22] Filed: May 23, 1997

[51] Int. Cl.[6] ...................................................... H01L 21/20
[52] U.S. Cl. ............................................. 438/172; 438/604
[58] Field of Search ..................................... 438/604–606, 438/167–172

[56] References Cited

U.S. PATENT DOCUMENTS 5,403,775   4/1995   Holonyak, Jr. et al. .
5,872,031   2/1999   Mishra et al. .

*Primary Examiner*—Jey Tsai
*Attorney, Agent, or Firm*—Eugene A. Parsons; Rennie W. Dover; William E. Koch

[57] ABSTRACT

A method of fabricating submicron HFETs includes forming a buffered substrate structure with a supporting substrate of GaAs, a portion of low temperature AlGaAs grown on the supporting substrate at a temperature of approximately 300° C., a layer of low temperature GaAs grown on the portion AlGaAs layer at a temperature of 200° C., a layer of low temperature AlGaAs grown on the GaAs layer at a temperature of 400° C., and a buffer layer of undoped GaAs grown on the second AlGaAs layer. Complementary pairs of HFETs can be formed on the buffered substrate structure, since the structure supports the operation of p and n type transistors equally well.

25 Claims, 1 Drawing Sheet

METHOD OF FABRICATING SUBMICRON FETS WITH LOW TEMPERATURE GROUP III-V MATERIAL

FIELD OF THE INVENTION

The present invention pertains to heterostructure field effect transistors and more specifically to heterostructure field effect transistors with improved operating characteristics.

BACKGROUND OF THE INVENTION

Field effect transistors (FETs) are used to a great extent in various logic and control circuits because of their low power requirements. As is known, many logic and control circuits use complementary devices to further reduce the power consumed in the circuits. Because of this extensive use, there is a need to make FETs smaller so that larger numbers of them can be incorporated into integrated circuits and the like. Also, by making the FETs smaller, especially with shorter gates, the operating frequency can be much higher and the devices can be used in high speed digital circuits and the like. Some of the smallest FETs are heterostructure FETs (HFETs), including heterostructure insulated gate field effect transistors (HIGFETs).

Prior art HFETs and especially p-channel HFETs cannot practically be made with very short gate lengths due to severe short channel effects such as high output conductance and subthreshold currents. Generally, prior art HFETs are constructed with a buffer layer on the substrate. Such buffer layers grown by a molecular beam epitaxy process are unintentionally doped, generally p-type. The buffer layers are p-doped about 1–3 E14 $cm^{-3}$. Subthreshold currents are determined by conduction through the buffer layers. While the subthreshold of N-channel devices is controlled reasonably well for devices of gate lengths, Lg, down to 0.3 $\mu ms$, due to the potential barrier resulting from the P-buffer which confines electrons, P-channel devices suffer severe short channel effects from conduction between the source and drain contacts.

For P-channel devices this is one of the key problems that prevents the successful fabrication of prior art submicron devices, especially complementary devices. As gate dimensions are reduced in these devices, from 1 $\mu m$ to lower levels (e.g. 0.5 $\mu m$), the subthreshold leakage currents increase almost exponentially from near nano-amperes to several hundred nano-amperes, or in some cases microamperes when the gate length is at 0.5 $\mu m$. Subthreshold slopes also increase substantially to several hundred millivolts per decade, and the devices do not pinch-off at all. Also, noise margins are severely degraded. Thus, these prior art devices become useless for complementary logic circuits as they are made smaller.

Accordingly, it would be advantageous to provide HFETs which could be fabricated in submicron ranges with improved operating characteristics.

It is a purpose of the present invention to provide a new and improved HFET and method of fabrication.

It is another purpose of the present invention to provide a new and improved HFET which can be manufactured in submicron ranges with substantially reduced subthreshold leakage currents.

It is still another purpose of the present invention to provide a new and improved P-channel HFET which can be manufactured with gate lengths under 0.5 $\mu m$ and subthreshold leakage currents in the nanoamperes.

It is a further purpose of the present invention to provide a new and improved method of fabricating HFETs which can be used to manufacture complementary HFETS.

SUMMARY OF THE INVENTION

The above problems and others are at least partially solved and the above purposes and others are realized in a method of fabricating submicron heterostructure field effect transistors by forming a buffered substrate structure including providing a supporting substrate of material in a III–V material system, growing a portion of low temperature material in the III–V material system on the supporting substrate at a temperature in a range of approximately 300° C. to 350° C., growing a first layer of low temperature material in the III–V material system on the portion of low temperature material at a temperature of approximately 200° C., growing a second layer of low temperature material in the III–V material system on the first low temperature layer of material at a temperature of approximately 200° C. to 600° C., and growing a buffer layer of material in the III–V material system on the second layer. At least one heterostructure field effect transistor is formed on the buffered substrate structure.

The above problems and others are at least partially solved and the above purposes and others are further realized in a submicron heterostructure field effect transistor device including a buffered substrate structure having a supporting substrate of material in a III–V material system, a portion of low temperature material in the III–V material system positioned on the supporting substrate, a first layer of low temperature material in the III–V material system positioned on the portion of low temperature material, a second layer of low temperature material in the III–V material system positioned on the first layer of low temperature material, and a buffer layer of material in the III–V material system positioned on the second layer. Complementary pairs of HFETs can be formed on the buffered substrate structure, since the structure supports the operation of p and n type transistors equally well.

BRIEF DESCRIPTION OF THE DRAWINGS

Referring to the drawings.

DESCRIPTION OF THE PREFERRED EMBODIMENTS

Figure 1:
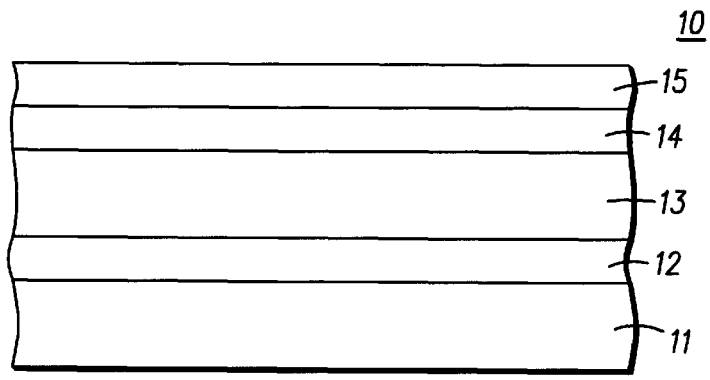
FIG. 1 is a simplified cross-sectional view illustrating a buffered substrate structure in accordance with the present invention.

Turning now to the drawings, attention is first directed to FIG. 1 in which a simplified cross-sectional view of a buffered substrate structure 10 in accordance with the present invention is illustrated. Structure 10 includes a supporting substrate 11 which is formed of gallium arsenide (GaAs). It should be understood that substrate structure 10 is utilized herein for illustrative purposes and additional or fewer layers might be included therein depending upon the application and specific material utilized. Also, while a GaAs supporting substrate 11 is utilized and a GaAs material system is disclosed for purposes of explanation, it should be understood that other III–V material systems might be utilized for specific applications.

Buffered substrate structure 10 includes a portion 12, which in this embodiment is a low temperature (LT) aluminum gallium arsenide (AlGaAs), formed on, or as a portion of, supporting substrate 11. A first layer 13, which in this embodiment includes a low temperature (LT) gallium arsenide (GaAs), is formed on portion 12. A second layer 14, which in this embodiment includes a low temperature (LT) aluminum gallium arsenide (AlGaAs), is formed on first layer 13. A buffer layer 15 including an undoped gallium arsenide (GaAs) is formed on second layer 14, in this embodiment, to complete the buffered substrate structure. Portion 12 and layers 13 through 15 are grown epitaxially in an MBE (molecular beam epitaxy) system, the use and operation of which is well known in the art. However, the manner of growth of the low temperature layers has significant effect on the final device performance. Inappropriately grown low temperature buffers and thicknesses can severely degrade device parameters such as Idss, Beta, Gm, etc.

Generally, because GaAs wafers, or substrates, have a thin layer of native oxide formed thereon, prior to starting the present process a standard oxide desorption process is performed in the growth chamber usually at a temperature of approximately 580° C.

Subsequent to the removal of the native oxide, the temperature of the substrate is lowered and the low temperature AlGaAs forming portion 12 is grown at a substrate temperature in a range of approximately 300° C. to 400° C. The growth of portion 12 continues until the thickness is in a range of approximately 100 Å to 300 Å thick. In a preferred embodiment the aluminum content of portion 12 is equal to or greater than approximately 75%. In some instances portion 12 may be optionally omitted and, thus, is simply included as a portion of supporting substrate 11 herein and, accordingly, layer 13 may be referred to hereafter as positioned on supporting substrate 11 with the understanding that in some embodiments portion 12 may be formed therebetween.

When portion 12 is completed, the temperature of the substrate is lowered and the low temperature GaAs forming layer 13 is grown at a substrate temperature in a range of approximately 200° C. The growth of layer 13 continues until the thickness is in a range of approximately 1000 Å to 6000 Å thick.

After layer 13 is completely formed, the temperature of the substrate is raised and the low temperature AlGaAs forming layer 14 is grown at a substrate temperature in a range of approximately 300° C. to 450° C. The growth of layer 13 continues until the thickness is a minimum of approximately 500 Å and typically in a range of approximately 500 Å to 1000 Å thick. In a preferred embodiment the aluminum content of layer 14 is equal to or greater than approximately 75%. In addition to preventing As diffusion upwardly into subsequently grown layers (e.g. buffer layer 15), layer 14 moves the back potential barrier arising from the pinned Fermi level in layer 13, spatially away from the undoped GaAs forming buffer layer 15. This minimizes the pinching effect of subsequent implanted dopants in the undoped GaAs buffer layer 15.

A band of defected region above layer 14, typically about 200 Å to 500 Å thick, has been observed when layer 14 is not properly grown. For example, the band of defects was observed with the thickness of layer 14 approximately 100 Å to 250 Å thick and grown at a temperature of 600° C. directly on the low temperature GaAs (layer 13). An AlGaAs layer with a thickness in excess of 500 Å, grown at 600° C. has a p-type conductivity which results in poor subthreshold currents in P-FETs even with the carrier confinement from the band-discontinuity at the GaAs/AlGaAs interface. The preferred AlGaAs barrier (layer 14) is grown at a low temperature (300° C. to 450° C.) to ensure it has a high resistivity. Further, layer 14 is grown with a thickness of at least 500 Å. By making the thickness of layer 14 at least 500 Å, the low temperature GaAs of layer 13 is prevented from severely depleting implanted dopants at the interface of layers 14 and 15 during processing and prevents diffusion of As from the low temperature material into the undoped GaAs buffer layer 15.

Further, the growth of the epitaxial structures described, under "non-optimum" growth conditions results in a large number of surface morphological defects such as "rice defects" and/or "cellular defects", resulting in hazy surface conditions when viewed under a bright light source. These surface defects result in extremely low yields during device processing.

After growth of barrier layer 14, the structure is annealed at a temperature of approximately 600° C. for 10 minutes under As overpressure in the MBE system, which results in As precipitation and a high resistivity buffered structure. One to several annealing steps can be utilized, as will be explained more fully later.

Once layer 14 is completed and any annealing steps have been performed, buffer layer 15 is epitaxially grown on the surface of layer 14. Layer 14 is grown to a thickness of approximately 1000 Å at the normal temperature near 600° C. Generally, any active device layers for HFETs and the like formed on buffered substrate 10 are also grown at normal temperatures near 600° C.

Figure 2:
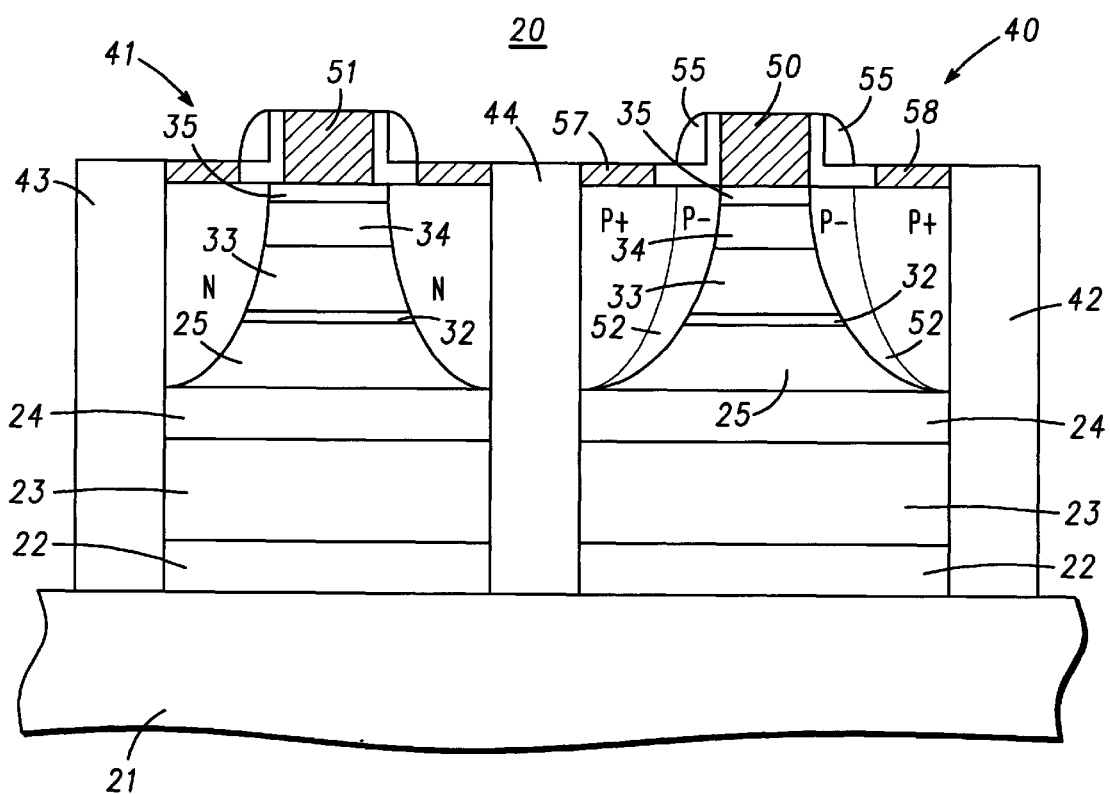
FIG. 2 is a simplified cross-sectional view illustrating a pair of complementary heterostructure field effect transistors formed on a buffered substrate structure similar to that illustrated in FIG. 1.

Turning now to FIG. 2, a simplified cross-sectional view is illustrated of a pair of complementary heterostructure field effect transistors 40 and 41 formed on a buffered substrate structure 20 similar to structure 10 of FIG. 1. Buffered substrate structure 20 includes a GaAs supporting substrate 21, a portion 22 of LT AlGaAs formed on, or as a portion of, supporting substrate 21, a first layer 23 of LT GaAs formed on portion 22, a second layer 24 of LT AlGaAs formed on first layer 23, and a buffer layer 25 including undoped GaAs formed on second layer 24, to complete buffered substrate structure 20.

In a specific example of the formation of at least one heterostructure field effect transistor on buffered substrate structure 20, a pulse layer 32 of material with Si delta doping is grown on buffer layer 25 and a channel layer 33 of InGaAs is grown on a thin Gaps spacer layer grown on layer 32. A layer 34 of $Al_{0.75}Ga_{0.25}As$ is grown on layer 33 and a thin GaAs cap layer 35 is grown on layer 34 to prevent oxidation of the $Al_{0.75}Ga_{0.25}As$.

Metal gate contacts 50 and 51 of refractory metal, such as TiWN or WSi, are formed on GaAs cap layer 35 by sputtering, photoresist definition and reactive ion etch. Using gate contacts 50 and 51 and sidewall technology for masking, self-aligned p-type implants are provided to form source and drain regions. Still referring to FIG. 2 and using HFET 40 as an example, gate contact 50 is used as an implant mask to form a lightly doped ($p^-$) region 52. Sidewalls 55 are formed at the edge of gate contact 50 using any of the standard methods, such as conformally depositing a dielectric layer of material and etching until only a sidewall remains. The combination of sidewalls 55 and gate contact 50 is then used as a mask for a $P^+$ contact implant 56. Generally, the $p^-$ resistivity is 1000–2000 ohms/sq and the $P^+$ resistivity is 200 ohms/sq. Implant activation is 700° C. to 800° C., minimizing out diffusion of impurities. In this specific example, the implants are co-implants of F⁺ and Be. Isolated areas for the fabrication of complementary HFETs 40 and 41 are isolated using an oxygen, boron, or helium isolation process. In FIG. 2, complementary HFETs 40 and 41 are isolated from other circuitry by implants 42 and 43 and are isolated from each other by a central implant 44, which implants extend through the various epitaxial layers to at least the surface of supporting substrate 21.

Cap layer 35 and AlGaAs layer 34 in the ohmic contact regions are etched to form source and drain contact areas. Metallization is then performed by any of the well known techniques such as evaporation and lift-off, to form a source contact 57 and a drain contact 58. It will be understood that HFET 41 is formed in a similar fashion, except that it is a complementary (N-type) HFET. While a specific heterostructure field effect transistor is illustrated and described, it will be understood that other types of HFETs and other semiconductor devices can be fabricated using the described process.

Two specific examples of the fabrication of buffered substrate structures which may be used for substrate structure 20 of FIG. 2 are described below.

EXAMPLE #1

In the first example, the AlGaAs layers (portion 22, if included, and layer 24) are grown at 300° C. and the GaAs layer (layer 23) is grown at 200° C. using a As/Ga pressure ratio greater than or equal to 17 in the pressure chamber of the MBE process. After the growth of the first AlGaAs portion (portion 22) the substrate temperature is ramped to 200° C. and allowed to stabilize for a period of between 2–5 minutes. The low temperature GaAs layer (layer 23) is then grown to a thickness of approximately 5000 Å. The substrate is next ramped to 600° C. at a rate of $\leq 1°$ C./sec. At 600° C. the layers are annealed for a minimum of 10 minutes followed by a temperature ramp down to 300° C. and a temperature stabilization period of 5–10 minutes. The next low temperature AlGaAs layer (layer 24) is then grown to a thickness in a range of 500 Å to 1000 Å, after which the temperature is again ramped up to 600° C. at a rate of $\leq 1°$ C./sec. The structure is then annealed for a period equal to or in excess of ten minutes. An undoped GaAs layer (layer 25) is grown on the surface of layer 24, at 600° C. and to a thickness of 1000 Å. Layers 32, 33, 34, and 35 are then grown on buffered substrate 20 at 600° C.

Since the surface mobility of the Al adatoms is significantly reduced at 300° C., by annealing the GaAs layer (layer 23) prior to the growth of the second AlGaAs layer (layer 24), any surface roughness caused by the low temperature GaAs growth is made smooth by the annealing process. As a result, there are a minimum number of nucleation sites for the Al island growth, thereby eliminating morphological defects.

EXAMPLE #2

In this example, the first AlGaAs (portion 22) is grown at 300° C., followed by the GaAs layer (layer 23) grown at 200° C., and the second AlGaAs layer (layer 24) grown at 400° C. using an As/Ga pressure ratio of no less than 17. In this example the annealing step after the growth of the GaAs layer (layer 23) is eliminated. After the growth of the first AlGaAs (portion 22), the substrate temperature is ramped to 200° C. and allowed to stabilize for a period in the range of 2–5 minutes. The low temperature GaAs is then grown, after which the substrate temperature is ramped to 400° C. at a rate of $\leq 1°$ C./sec and allowed to stabilize for a period in the range of 2–5 minutes. At 400° C. the second AlGaAs layer (layer 24) is grown to a thickness in a range of 500 Å–1000 Å, after which the substrate temperature is ramped to 600° C. at a rate of $\leq 1°$ C./sec. The structure is then annealed for a period of at least 10 minutes. An undoped GaAs layer (layer 25) is grown on the surface of layer 24, at 600° C. and to a thickness of 1000 Å. Layers 32, 33, 34, and 35 are then grown on buffered substrate 20 at 600° C.

Compared to a growth temperature, for example, of 300° C., the surface mobility of the Al adatoms is greater at 400° C. As a result, surface defects created by Al clustering is minimized. However, if the thickness of the AlGaAs is reduced the AlGaAs growth temperature may be reduced and still maintain a defect free surface.

Thus, the buffered substrate structure of the present invention reduces subthreshold currents of both N-channel and particularly more so with P-channel devices, to enable submicron and deep submicron complementary HFETs to be fabricated. Also, degradation of source series resistance and FET parametrics are minimized. The buffered substrate structure also improves radiation hardness of FETS, due to the low temperature buffer. Further, an advantage of the deposition approach is the elimination of wafer morphological defects which affect yield of integrated circuits. Therefore, a new and improved HFET and method of fabrication is disclosed. The new and improved HFET can be manufactured in submicron ranges with substantially reduced subthreshold leakage currents. Further, complementary HFETs can be manufactured with submicron gate lengths and subthreshold leakage currents in the nanoamperes.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A method of fabricating submicron heterostructure field effect transistors comprising the steps of:
    forming a buffered substrate structure including the steps of
        providing a supporting substrate of material in a III–V material system,
        growing a first layer of low temperature material in the III–V material system on the supporting substrate at a temperature of approximately 200° C.,
        growing a second layer of low temperature material in the III–V material system with a thickness in excess of approximately 500 Å on the first low temperature layer of material at a temperature of approximately 300° C. to 450° C., and
        growing a buffer layer of material in the III–V material system on the second layer; and
    forming at least one heterostructure field effect transistor on the buffered substrate structure.

2. A method of fabricating a submicron heterostructure field effect transistor as claimed in claim 1 wherein the step of providing the supporting substrate of material in the III–V material system includes providing a supporting substrate of GaAs.

3. A method of fabricating a submicron heterostructure field effect transistor as claimed in claim 1 wherein the step of providing a supporting substrate includes in addition a step of growing a portion of low temperature material in the III–V material system on the supporting substrate at a temperature in a range of approximately 300° C. to 400° C., the portion of low temperature material being positioned in underlying relationship to the first layer.

4. A method of fabricating a submicron heterostructure field effect transistor as claimed in claim 3 wherein the step of growing the portion of low temperature material in the III–V material system includes growing a layer of low temperature AlGaAs.

5. A method of fabricating a submicron heterostructure field effect transistor as claimed in claim 4 wherein the step of growing the portion of low temperature material in the III–V material system includes growing a layer with a thickness in a range of approximately 100 Å to 300 Å.

6. A method of fabricating a submicron heterostructure field effect transistor as claimed in claim 1 wherein the step of growing the first layer of low temperature material in the III–V material system includes growing a layer of low temperature GaAs.

7. A method of fabricating a submicron heterostructure field effect transistor as claimed in claim 6 wherein the step of growing the first layer of low temperature material in the III–V material system includes growing a layer with a thickness in a range of approximately 1000 Å to 6000 Å.

8. A method of fabricating a submicron heterostructure field effect transistor as claimed in claim 1 wherein the step of growing the second layer of low temperature material in the III–V material system includes growing a layer of low temperature AlGaAs.

9. A method of fabricating a submicron heterostructure field effect transistor as claimed in claim 8 wherein the step of growing the second layer of low temperature material in the III–V material system includes growing a layer with a thickness in a range of 500 Å to 1000 Å.

10. A method of fabricating a submicron heterostructure field effect transistor as claimed in claim 1 wherein the step of growing the buffer layer of material in the III–V material system includes growing a layer of undoped GaAs.

11. A method of fabricating a submicron heterostructure field effect transistor as claimed in claim 10 wherein the step of growing the buffer layer of material includes growing the buffer layer of material with a thickness in a range of 500 Å to 1000 Å.

12. A method of fabricating a submicron heterostructure field effect transistor as claimed in claim 1 including in addition at least one step of annealing the first and second layers at a temperature of approximately 600° C.

13. A method of fabricating a submicron heterostructure field effect transistor as claimed in claim 1 wherein the step of forming at least one heterostructure field effect transistor includes forming a complementary pair of heterostructure field effect transistors.

14. A method of fabricating a submicron heterostructure field effect transistors comprising the steps of:
forming a buffered substrate structure including the steps of
providing a supporting substrate including GaAs,
growing a portion of low temperature AlGaAs on the supporting substrate at a temperature in a range of approximately 300° C. to 400° C. and with a thickness in a range of approximately 100 Å to 300 Å,
growing a first layer of low temperature GaAs on the portion at a temperature of approximately 200° C. and with a thickness of approximately 1000 Å to 6000 Å,
growing a second layer of low temperature AlGaAs on the first layer at a temperature of approximately 300° C. to 450° C. and with a thickness greater than 500 Å, and growing a buffer layer of undoped GaAs on the second layer at a temperature of approximately 600° C. and with a thickness of approximately 1000 Å; and
forming at least one heterostructure field effect transistor on the buffered substrate structure.

15. A method of fabricating a submicron heterostructure field effect transistor as claimed in claim 14 including in addition at least one step of annealing the first and second layers at a temperature of approximately 600° C.

16. A method of fabricating a submicron heterostructure field effect transistor as claimed in claim 14 wherein the step of forming at least one heterostructure field effect transistor includes forming a complementary pair of heterostructure field effect transistors.

17. A method of fabricating submicron heterostructure field effect transistors comprising the steps of:
forming a buffered substrate structure including the steps of
providing a supporting substrate including GaAs,
growing a portion of low temperature AlGaAs with a thickness in a range of approximately 100 Å to 300 Å on the supporting substrate at a substrate temperature in a range of approximately 300° C. to 400° C. using molecular beams containing As and Ga in a MBE growth chamber with an As/Ga ratio equal to or greater than approximately 17,
growing a first layer of low temperature GaAs with a thickness of approximately 1000 Å to 6000 Å on the portion at a substrate temperature of approximately 200° C. using molecular beams containing As and Ga in a MBE growth chamber with an As/Ga ratio equal to or greater than approximately 17,
annealing the portion and first layer at a substrate temperature of approximately 600° C.,
growing a second layer of low temperature AlGaAs with a thickness greater than 500 Å on the second layer at a substrate temperature of approximately 300° C. to 450° C. using molecular beams containing As and Ga in a MBE growth chamber with an As/Ga ratio equal to or greater than approximately 17,
annealing the second layer at a substrate temperature of approximately 600° C., and
growing a buffer layer of undoped GaAs on the second layer at a substrate temperature of approximately 600° C. and with a thickness of approximately 1000 Å; and
forming at least one heterostructure field effect transistor on the buffered substrate structure.

18. A method of fabricating submicron heterostructure field effect transistors as claimed in claim 17 wherein the step of growing the first layer of low temperature GaAs includes ramping the temperature to approximately 200° C. after the step of growing the portion and allowing the temperature to stabilize for a period in a range of 2–5 minutes.

19. A method of fabricating submicron heterostructure field effect transistors as claimed in claim 17 wherein the step of annealing the portion and first layer includes ramping the substrate temperature up to approximately 600° C. at a rate equal to or less than approximately 1° C./sec after the step of growing the first layer, annealing for a minimum of approximately 10 minutes, ramping the substrate temperature down to approximately 300° C., and allowing the substrate temperature to stabilize for a period in a range of 5–10 minutes before performing the step of growing the second layer.

20. A method of fabricating submicron heterostructure field effect transistors as claimed in claim 17 wherein the step of annealing the second layer of low temperature AlGaAs includes ramping the substrate temperature up to approximately 600° C. at a rate equal to or less than approximately 1° C./sec after the step of growing the second layer, annealing for a minimum of approximately 10 minutes, ramping the substrate temperature down to approximately 300° C., and allowing the substrate temperature to stabilize for a period in a range of 5–10 minutes before performing the step of growing the buffer layer.

21. A method of fabricating a submicron heterostructure field effect transistor as claimed in claim 17 wherein the step of forming at least one heterostructure field effect transistor includes forming a complementary pair of heterostructure field effect transistors.

22. A method of fabricating submicron heterostructure field effect transistors comprising the steps of:
   forming a buffered substrate structure including the steps of
      providing a supporting substrate including GaAs,
      growing a portion of low temperature AlGaAs with a thickness in a range of approximately 100 Å to 300 Å on the supporting substrate at a substrate temperature in a range of approximately 300° C. to 400° C. using molecular beams containing As and Ga in a MBE growth chamber with an As/Ga ratio equal to or greater than approximately 17,
      growing a first layer of low temperature GaAs with a thickness of approximately 1000 Å to 6000 Å on the portion at a substrate temperature of approximately 200° C. using molecular beams containing As and Ga in a MBE growth chamber with an As/Ga ratio equal to or greater than approximately 17,
      growing a second layer of low temperature AlGaAs with a thickness greater than 500 Å on the first layer at a substrate temperature of approximately 400° C. using molecular beams containing As and Ga in a MBE growth chamber with an As/Ga ratio equal to or greater than approximately 17,
      annealing the first and second layers at a substrate temperature of approximately 600° C., and growing a buffer layer of undoped GaAs on the second layer at a substrate temperature of approximately 600° C. and with a thickness of approximately 1000 Å; and
   forming at least one heterostructure field effect transistor on the buffered substrate structure.

23. A method of fabricating submicron heterostructure field effect transistors as claimed in claim 22 wherein the step of annealing the first and second layers includes ramping the substrate temperature up to approximately 600° C. at a rate equal to or less than approximately 1° C./sec after the step of growing the second layer, annealing for a minimum of approximately 10 minutes, ramping the substrate temperature down to approximately 300° C., and allowing the substrate temperature to stabilize for a period in a range of 5–10 minutes before performing the step of growing the buffer layer.

24. A method of fabricating submicron heterostructure field effect transistors as claimed in claim 22 wherein the step of growing the second layer of low temperature AlGaAs includes ramping the temperature to approximately 400° C. at a rate equal to or less than approximately 1° C./sec after the step of growing the second layer and allowing the temperature to stabilize for a period in a range of 2–5 minutes.

25. A method of fabricating a submicron heterostructure field effect transistor as claimed in claim 22 wherein the step of forming at least one heterostructure field effect transistor includes forming a complementary pair of heterostructure field effect transistors.

\* \* \* \* \*